United States Patent [19]
Baumgartner et al.

[11] Patent Number: 5,825,692
[45] Date of Patent: Oct. 20, 1998

[54] MEMORY SYSTEM AND METHOD FOR SIMULTANEOUSLY READING AND WRITING DATA

[75] Inventors: Robert Baumgartner, Worth; Hans-Detlef Gröger, Kirchheim, both of Germany

[73] Assignee: Siemens Nixdorf Informationssysteme Aktiengesellschaft, Paderborn, Germany

[21] Appl. No.: 809,390

[22] PCT Filed: Sep. 20, 1995

[86] PCT No.: PCT/DE95/01294
§ 371 Date: Mar. 20, 1997
§ 102(e) Date: Mar. 20, 1997

[87] PCT Pub. No.: WO96/09627
PCT Pub. Date: Mar. 28, 1996

[30] Foreign Application Priority Data
Sep. 23, 1994 [DE] Germany .................... 44 34 107.5

[51] Int. Cl.⁶ ..................................... G11C 7/00
[52] U.S. Cl. .................. 365/189.04; 365/221; 365/236; 365/230.02; 365/239
[58] Field of Search ............... 365/189.04, 219, 365/220, 221, 189.12, 189.07, 236, 230.02, 239, 240

[56] References Cited

U.S. PATENT DOCUMENTS

| | | | |
|---|---|---|---|
| 4,171,538 | 10/1979 | Sheller | 364/934.2 |
| 4,809,156 | 2/1989 | Taber | 711/217 |
| 4,987,559 | 1/1991 | Miyauchi et al. | 365/189.04 |

FOREIGN PATENT DOCUMENTS

| | | | |
|---|---|---|---|
| 0 155 731 A1 | 9/1985 | European Pat. Off. | G11C 8/00 |
| 0 306 726 A2 | 3/1989 | European Pat. Off. | G11C 7/00 |
| 0 447 266 A2 | 9/1991 | European Pat. Off. | G06F 5/06 |

OTHER PUBLICATIONS

Patent Abstracts of Japan, vol. 8, No. 60, (P–262), 22 Mar. 1984 & JP 58–208905 (Sony KK) 05 Dec. 1983.
Patent Abstracts of Japan, vol. 18, No. 113, (E–1514), 23 Feb. 1994 & JP 05–308544 (Matsushita Electric) 19 Nov. 1993.
Patent Abstracts of Japan, vol. 14, No. 76, (P–1005), 13 Feb. 1990 & JP 01–291321 (Mitsubishi Electric) 22 Nov. 1989.

Primary Examiner—David C. Nelms
Assistant Examiner—Andrew Q. Tran
Attorney, Agent, or Firm—Hill & Simpson

[57] ABSTRACT

A storage device (SP) which is used for the sequential storage and reading out of a given amount of data. To this end it contains a memory (RAM) which can be read and written into in parallel and a storage control unit (CON) which ensures that storage areas whose data have previously been read out at least once is written into sequentially and successively with a default safety clearance. In a special configuration, an input interface (SPU) and an output interface (PSU) are arranged upstream and downstream, respectively, of the memory (RAM). These interfaces accept and transfer the data serially outwards and in parallel to the memory (RAM), respectively.

6 Claims, 3 Drawing Sheets

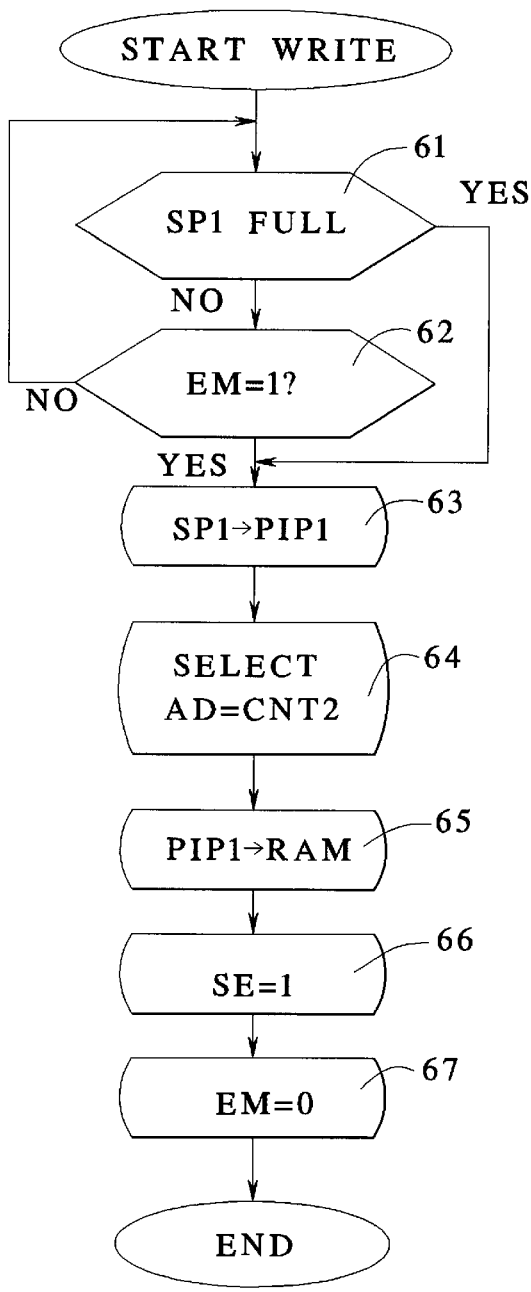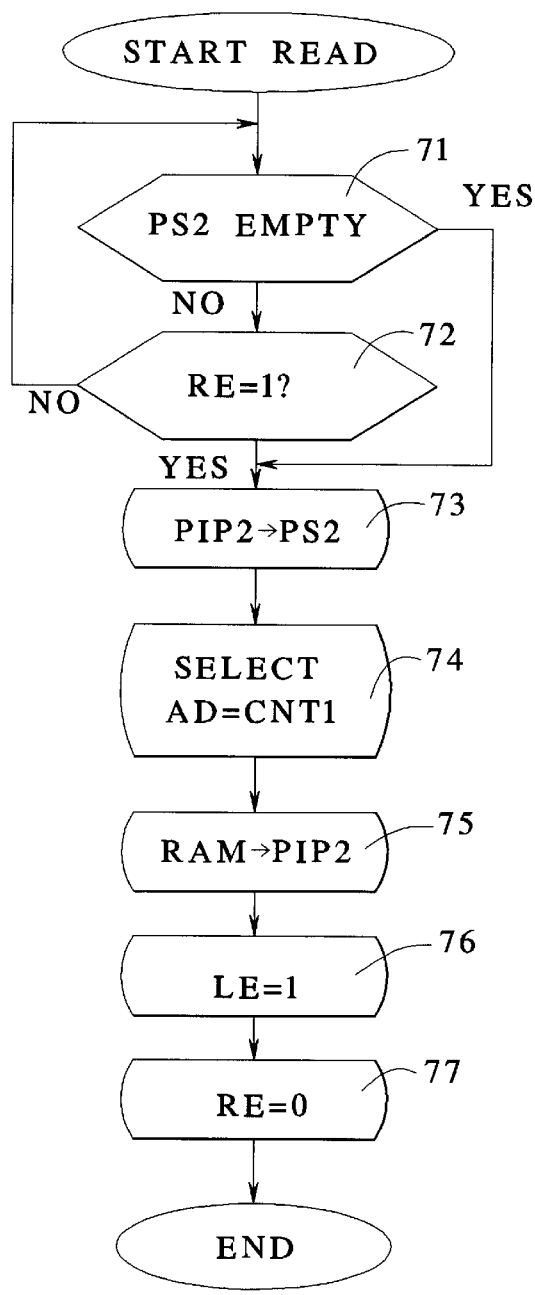

MEMORY SYSTEM AND METHOD FOR SIMULTANEOUSLY READING AND WRITING DATA

BACKGROUND OF THE INVENTION

The invention is directed to a memory means and a method for simultaneously reading and writing data. Inventive memory means are needed, for example, in the compression and decompression of image information. An image that, for example, contains a graphic, text or the like, is composed of a plurality of picture elements, what are referred to as pixels, that are arranged matrix-like. Each row of this matrix contains a plurality of picture elements that represent either the value "white" or "black". These pixels can then be made visible with a picture screen, a printer or some other image reproduction means. The image information is compressed for transporting or storing an image. The compressed image information can be decompressed and made visible again.

Such compression and decompression methods are known from facsimile technology and are described, for example, in CCITT, The International Telegraph Consultative Committee", Blue Book, Vol. VII-Facsimile VII.3, Recommendations T.0–T.63. Other compression and decompression rules such as, for example, of HP (Hewlett Packard) are employed in addition to these compression and decompression rules defined by the CCITT. Algorithms are applied in these standard rules that not only link the information within a line with one another (for example, Huffman encoding) but that also implement a linking of the image information of two successive lines. A processing unit that implements the linking operation is required in order to undertake such a linking. This processing unit must also have a memory means allocated to it from which a pixel of a reference line required at the moment must always be capable of being read and into which a generated pixel of a current line must be capable of being written.

European reference EP 0 341 272 B1 discloses a decoding means that generates pixels from image information encoded according to CCITT. To that end, a processing means collaborates with a memory means. The memory means contains two separate memories, one of which contains all pixels of the reference line. The pixels generated during the decoding are sequentially written into the other memory in succession. When the current line has been completely decoded, then all pixels of this line are in the memory for the current line. The former reference line is no longer required and the current line should serve as reference line in the decoding of the following line. The memory entries of the memory for the current line are therefore transferred into the memory for the reference line. Subsequently, the decoding of the next line is begun upon employment of the new reference line.

In the Prior Art, an increase in the speed of the processing unit in the decompression of image data is achieved by constructing the memory means with two separate memories that can be simultaneously read and written. However, there is a great need for fast memories due to this increase in speed. This high memory requirement uses a comparatively large semiconductor area. This, however, is generally not available since the image processing means is usually realized by an integrated circuit in the form of an ASIC (Application Specific Integrated Circuit). High demands made of the processing speed can be met with these components. Due to the limited area available on an ASIC, the area required for the memory means must be reduced to a minimum. Due to their area requirement, in particular, memory structures of a video RAM can definitely not be implemented in an ASIC given current technology. A transfer of the memories out of the ASIC can be undertaken but is generally not desirable.

U.S. Pat. No. 4,987,559 discloses a memory means (video RAM) with shift registers for the serial reception of data and for the serial output of data. The data are respectively transmitted into a matrix memory or, respectively, output therefrom in parallel. A critical basis for the functionability of the known memory means is the length of the shift register adapted to the plurality of columns of the matrix memory. Two such shift registers are needed for enabling a simultaneous reading and writing of data. This fact opposes an employment of the known memory means for minimization of the area of a memory means.

U.S. Pat. No. 4,171,538 discloses a module for clock matching. This circuit converts received data of a reproduced clock into data with a data rate of a local clock. To that end, a defined address spacing is set at a point in time between the data to be read out and the received data. An address collision can occur due to the incrementing of the address counters with the two non-synchronous clocks. A data loss occurs given great clock differences.

European reference EP-A2-0306726 discloses an integrated circuit with which data can be intermediately stored. Two memory arrays are integrated in this memory module. A fast access to the memory locations for reading or writing can be achieved by an alternating access to respectively one of the arrays. The information to be processed is deposited in two separate memories integrated on a chip. Although this separate memory arrangement yields the advantage that a fast access is enabled, it also means that there is a high area requirement on the semiconductor.

SUMMARY OF THE INVENTION

The present invention is based on the object of disclosing a memory means and a method for simultaneously reading and writing data that, particularly given the compression and decompression of image information, especially in an ASIC module, enable a high processing speed given minimal memory requirement.

In general terms the present invention is a memory means for simultaneously reading and writing data. It has a memory, whereby data can be word-sequentially written and word-sequentially read. A memory control means contains first and second addressing means. The memory control means contains a register that can be set to a defined value, which is followed by a subtractor that subtracts a prescribable amount from the current value of the register. The output of the register is coupled to inputs for writing a read address into a first incrementable and loadable memfory and to the inputs of the subtractor. The output of the subtractor is coupled to inputs for writing a write address into a second incrementable and loadable memory and to the inputs of the register. The incremental memories are incrementable independently of one another with a respective control line. A controllable selection means determines which of the contents of the incrementable memories is to be used as memory addressing. The incrementing ensues that, when writing and reading, the data in the memory is only overwritten when they have been read out at least once.

An input interface serially accepts data and outputs the data in parallel to the memory. An output interface accepts data in parallel from the memory and outputs the data serially.

An input interface contains a serial-to-parallel converter and a first buffer memory that accepts the data from the serial-to-parallel converter and outputs the data to the memory. An output interface contains a parallel-to-serial converter and a second buffer memory that accepts data from the memory and outputs the data to the parallel-to-serial converter.

The register accepts the data from the subtractor given drive by a corresponding pulse.

The incrementable memories are loadable counters.

The present invention is also a method simultaneously reading and writing data. A memory, into which data can be word-sequentially written and word-sequentially read, is controllable by a memory control means containing first and second addressing means. A register is set to a predefined value is transferred into a first incrementable memory and into a subtractor. The predefined value diminished by a predefined amount by the subtractor is transferred into a second incrementable memory. Reading and writing the memory occurs by repeated addressing of the memory with the content of the first memory, reading or writing of data from or, respectively, into the memory area of the memory selected according to content of the first memory, incrementing of the first memory, addressing the memory with the content of the second memory, writing or, respectively, reading data into or, respectively, out of the memory area of the memory selected according to content of the second memory. Whereby data is only overwritten when they have been read at least once, and incrementing the second memory. Serially incoming data is accepted by an input interface and data is simultaneously serially output by an output interface.

Advantageous developments of the method of the present invention are as follows.

The serially incoming data is accepted by the input interface and is written in parallel into the respectively selected memory area of the memory. Data is read out parallel from the respectively selected memory area of the memory and is handed over to the output interface that serially outputs the data.

The inventive memory means contains only a single memory. This memory needs only a slightly larger capacity than required for the acceptance of the pixels of a complete line of an image. As a result of being capable of being simultaneously written and read, the memory means meets the demand in accord wherewith individual pixels of the reference line must be read from and generated pixels of the current line must be written into the memory means simultaneously. The area requirement of the memory means is nonetheless only about half as big as in known image processing devices for the sequential encoding and decoding of image information. The memory means can thus be accommodated on an ASIC module on which only single-port RAMs or dual-port RAMs are available that can only be written and read out in parallel with limited bit width. Serial data are processed during a single clock. The dependability of the memory means is especially suited for the demands in the compression and decompression of image information wherein it is a matter of a continuous procedure that cannot be arrested.

According to a development and embodiment of the invention, the memory means comprises an input interface that serially accepts pixels of the current line and outputs them parallel in blocks. An output interface accepts the pixels of the reference line from the memory in parallel and outputs them serially toward the outside. As a result of this serial-to-parallel or, respectively, parallel-to-serial conversion, a memory can be used within the memory means that only has to satisfy considerably lower speed demands than a memory that accepts and outputs pixels serially. Moreover, a further reduction of the memory area is achieved in that, due to the time gained within the memory means, a simultaneous reading and writing is not required. A single-port RAM (Random Access Memory) can therefore be employed for the realization. This requires less memory area than a dual-port RAM that would otherwise have to be employed.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 6 is a flowchart of the sub-program for writing data into the memory means; and FIG. 7 is a flowchart of the sub-program for reading data from the memory means.

DESCRIPTION OF THE PREFERRED EMBODIMENTS

The following describes a memory means that is utilized in an image processing device for the sequential decoding of image information. It is self-evident that the memory means can be analogously utilized in other environments such as, for example, in an image processing device for the sequential encoding of image information that is not described here.

Figure 1:
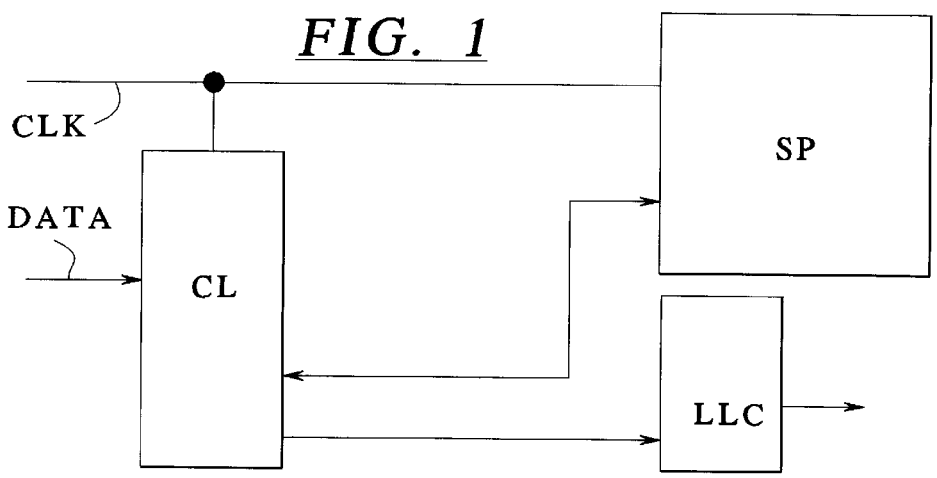
FIG. 1 is a block circuit diagram of an image processing device with an inventive memory means and a control logic.

An image processing device is constructed as shown in the block circuit diagram of FIG. 1. A control logic CL is coupled to a memory means SP. Compressed data DATA are handed over to the control logic CL. After the decoding, the control logic CL outputs an image information separated into run length and color information to a run length encoder LLC that generates the individual pixels for the image reproduction from the run length and color information. In order to assure a synchronous working of the control logic CL and the memory means SP, a common clock CLK is supplied to these components.

Figure 2:
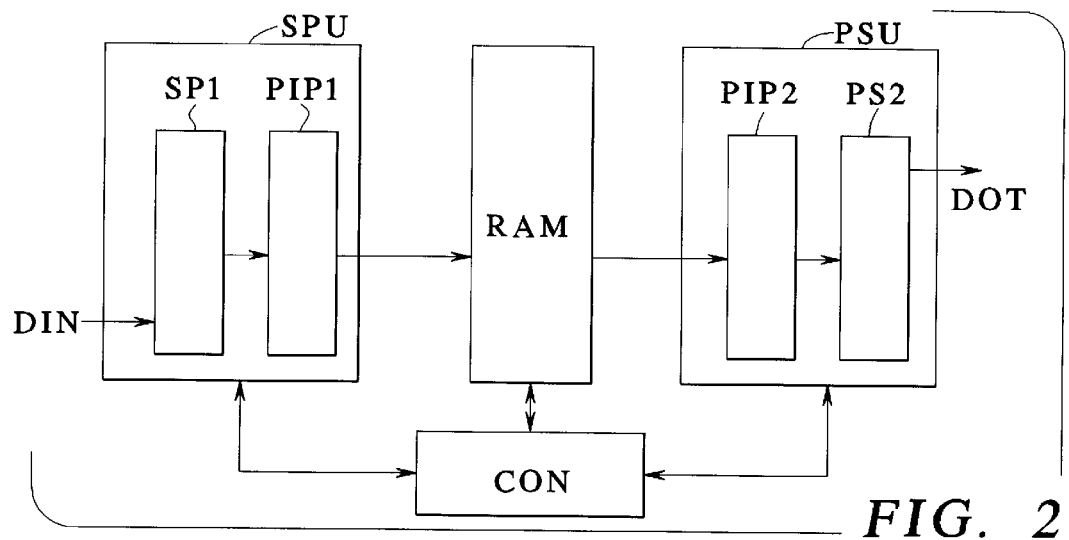
FIG. 2 is a block circuit diagram of the inventive memory means.

As shown in FIG. 2, the memory means SP contains a input interface SPU, a memory RAM and an output interface PSU that are coupled to one another. The input interface SPU contains a serial-to-parallel converter SP1 into which input data DIN in the form of individual pixels can be serially written. This serial-to-parallel converter SP1 is followed by a buffer memory PIP1. Input data DIN serially written in the serial-to-parallel converter SP1 can be transferred parallel into the buffer memory PIP1. The parallel input data DIN are written parallel into the memory RAM from the buffer memory PIP1. A memory control means CON coupled with the components of the memory means SP thereby determines the address of the memory location in the memory RAM at which the input data DIN are deposited. This memory control means CON also determines the address of the output data DOT that are handed over parallel to a second buffer memory PIP2 that is contained in the output interface PSU. The output data DOT can be written from this second buffer memory PIP2 into a parallel-to-serial converter PS2. This parallel-to-serial converter PS2 serially outputs the output data DOT to the outside in the form of individual pixels.

Figure 3:
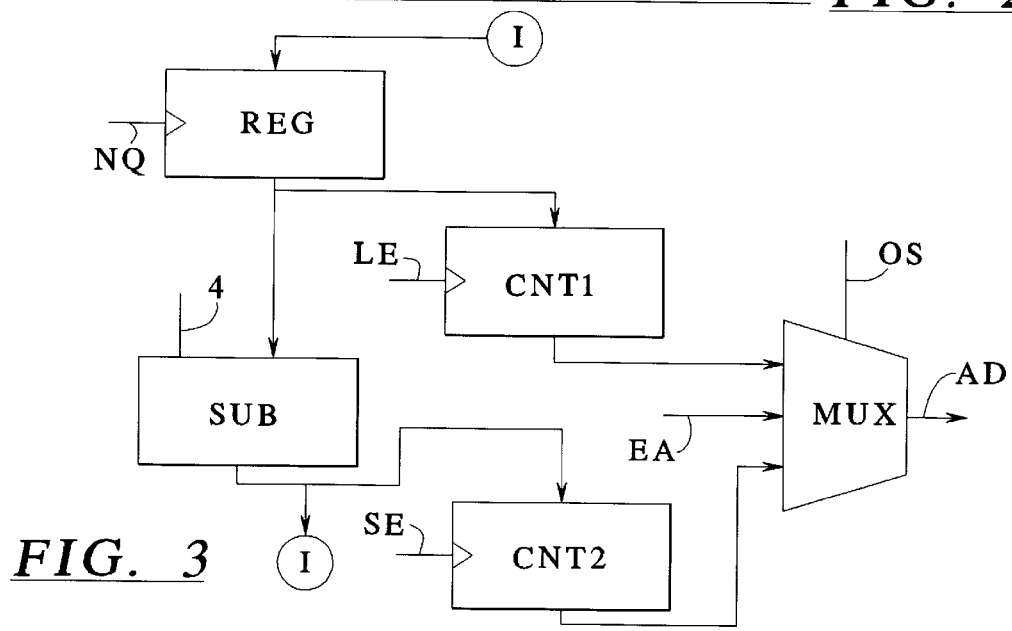
FIG. 3 is a block circuit diagram of the inventive address generating within the memory means.

The unit for the addressing that is contained in the memory control means CON of the memory unit SP is constructed according to FIG. 3. The output of a register REG loadable parallel is coupled to an input of a subtractor SUB and to an input of a first loadable counter CNT1. The output of the first counter CNT1 is conducted to an input of a 3:1 multiplexer MUX. The output of the subtractor SUB is coupled to the input of the register REG and to the input of a second loadable counter CNT2. The output of the second counter CNT2 is coupled to a further input of the multiplexer MUX. An external address EA can be applied to a third input of the multiplexer MUX for testing purposes. One of the three addresses AD present at the inputs of the multiplexer MUX can be selected with the assistance of a signal adjacent at a selection line OS of the multiplexer MUX. This is employed for addressing the memory RAM.

The first loadable counter CNT1 determines the read address. When an addressing with a first counter reading of this counter CNT1 has ensued, this counter reading is then incremented by 1 by a signal LE. The second loadable counter CNT2 determines the write address. When an addressing with a first counter reading of this counter CNT2 has ensued, then this counter reading is incremented by 1 by a signal SE. As a result of the subtractor SUB, the counter reading of the first counter CNT1 after the loading by the register REG is 4 higher than the counter reading of the second counter CNT 2 after the loading by the subtractor SUB.

The memory RAM is controlled by the method steps according to FIGS. 4 through 7. At the beginning of a new line, the memory control means CON receives a signal NQ from the control logic CL. The memory control means CON recognizes the signal NQ and starts the sub-program INIT for the initialization of the memory means SP.

Figure 5:
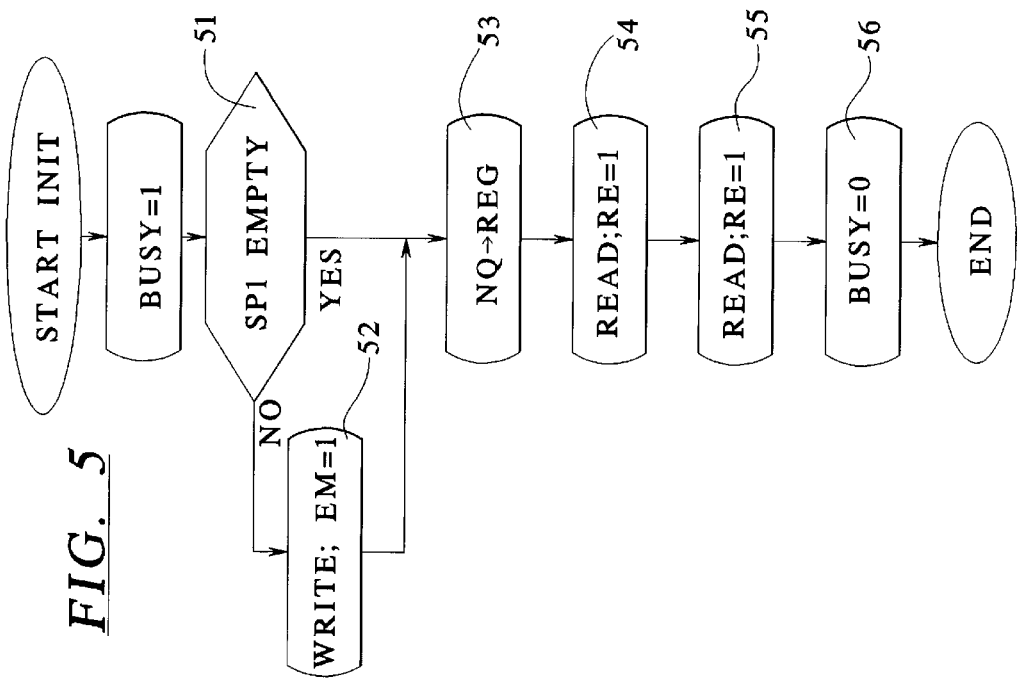
FIG. 5 is a flowchart of the sub-program for the initialization of the memory means.

The sub-program INIT for the initialization of the memory means SP is shown in FIG. 5. After being called, this sub-program sets a variable BUSY=1, this signalling the control logic CL that a memory access is not possible at the time. In a first step 51, the sub-program INIT subsequently checks whether the serial-to-parallel converter SP1 is empty. When pixels are still contained in the serial-to-parallel converter, a sub-program WRITE for the transfer of the pixels from the serial-to-parallel converter SP1 into the memory RAM is started in a second step 52. A variable EM=1 is set therefor.

The sub-program WRITE is shown in FIG. 6. In a first step 61, it constantly monitors whether the serial-to-parallel converter SP1 is filled with pixel information. Monitoring is carried out in a second step to see whether the sub-program INIT has set the write variable EM to the value 1. When at least one of the two conditions is met, the sub-program WRITE initiates the transfer of the pixels from the serial-to-parallel converter SP1 into the first buffer stage PIP1 with the memory control means CON in a third step 63. In a fourth step 64, the multiplexer MUX of the memory control means according to FIG. 3 receives an information via its selection line OS on the basis whereof the counter reading of the second loadable counter CNT2 is through-connected to its output AD. In a fifth step 65, the pixel information is transferred from the first buffer memory PIP1 to the memory area of the memory RAM defined by this address AD and is stored. In a sixth step 66, the memory control means CON generates a signal SE with which the second loadable counter CNT2 is incremented by one. It is thus assured that the next pixel information is written into the immediately following memory area. In a seventh step 67, the variable EM=0 is set and the sub-program WRITE is ended.

The sub-program INIT for the initialization according to FIG. 5 is continued with a third step 53. In this step, the memory control means CON is switched by a signal NQ conducted to the register REG. A first loading event LA1 ensues as a result. The first loadable counter CNT1 is thereby loaded with the content of the register REG. At the same time, the second loadable counter CNT2 is loaded with the content of the register REG reduced by four by the subtractor SUB. The output of the subtractor SUB is also conducted to the input of the register REG, as a result whereof the register REG is reloaded with its value reduced by four. As a result of this measure, the write event always begins at an address that is lower by four than the read address. In the next loading event LA2 of the counters CNT1, CNT2, the first counter CNT1 again receives the content of the registers REG that corresponds to the preceding start value of the second counter CNT2. At the beginning of each raster line, thus, reading is begun where a raster line was previously begun with the writing. A spacing of four addresses is adhered to. Given a memory width of one byte, a spacing of 4*8=32 pixels derives between the reading of the reference line and the writing of the current line. The following table illustrates this.

|      | RESET | LA1 | LA2 | LA3 |
|------|-------|-----|-----|-----|
| REG  | 0     | −4  | −8  | −12 |
| CNT1 | 0     | 0   | −4  | −8  |
| CNT2 | 0     | −4  | −8  | −12 |

Proceeding from a basic condition wherein all counters CNT1, CNT2 and registers REG are set to zero, the first loadable counter CNT1 is set to the value zero in the first loading event LA1. The second loadable counter CNT2 is set to the start value −4, and the register REG is loaded with the value −4. In the second loading event LA2, the first loadable counter CNT1 is loaded with the register content −4, and the second loadable counter CNT2 is loaded with the four-deincremented register value −8. The value −8 is in turn entered into the register REG. In the third loading event LA3, the first loadable counter CNT1 is correspondingly loaded with the value −8, and the second loadable counter CNT2 is loaded with the four-deincremented value −12. This value is also transferred into the register REG, so that the described events can be continued in the following loading events.

In a fourth step 54, the sub-program INIT for the initialization starts a sub-program READ for reading pixels from the memory RAM. A flowchart of this sub-program is shown in FIG. 7. In a first step 71, the sub-program READ constantly checks whether the parallel-to-serial converter PS2 is empty. In a second step 72, a check is made to see whether a read variable RE is set to the value 1. This setting of the read variables RE is undertaken in the fourth step 54 of the sub-program INIT. When one of the conditions of the first two steps 71, 72 is satisfied, then the pixels are transferred from the second buffer memory PEP2 [sic] into the parallel-to-serial converter PS2 in a third step 73. In a fourth step 74, the counter reading of the first counter CNT1 is selected as address AD with the assistance of the selection line OS of the multiplexer MUX of the memory control means CON. The memory RAM is addressed with this address AD. In the following fifth step 75, the corresponding memory content of the memory RAM is transferred into the second buffer memory PIP2. In the following sixth step 76, the first loadable memory CNT1 is incremented by the signal LE. The read variable RE is reset with the seventh step 77. Thus, the content of the second buffer memory PEP2 [sic] is transferred into the parallel-to-serial converter PS2 with the sub-program for reading the pixels, the second buffer memory PEP2 [sic] is loaded with the pixels required next from the memory RAM, and the first loadable counter CNT1 is set for addressing the next byte of pixels to be read from the memory RAM.

The sub-program for the initialization INIT is continued with a fifth step 55 wherein the read variable RE is again set. By again working off the sub-program READ for reading the pixels, the first eight pixels of a new line are transferred into the parallel-to-serial converter PS2. The second eight pixels of the new line proceed into the second buffer memory PEP2 [sic], and the address of the third required eight pixels of the new line is set in the first loadable counter CNT1. In a sixth step 56, the wait signal BUSY is reset and the sub-program INIT for the initialization is ended.

Subsequently, the control logic CL reads pixels of the reference line from the memory means SP bit-by-bit and writes pixels of the current line into the memory means SP bit-by-bit. An addressing from the outside does not ensue because the disclosed memory means assures that the pixels written into the memory means SP in a specific sequence are also in turn output therefrom in the same sequence. The sub-programs READ and WRITE of the memory control means CON of the memory means SP see to it that pixels can always be written into the serial-to-parallel converter SP1 and pixels can always be read from the parallel-to-serial converter PS2. The monitoring to see whether the serial-to-parallel converter SP1 is full or, respectively, the parallel-to-serial converter PS2 is empty is undertaken by specific counters allocated to the converters SP1, PS2.

Figure 4:
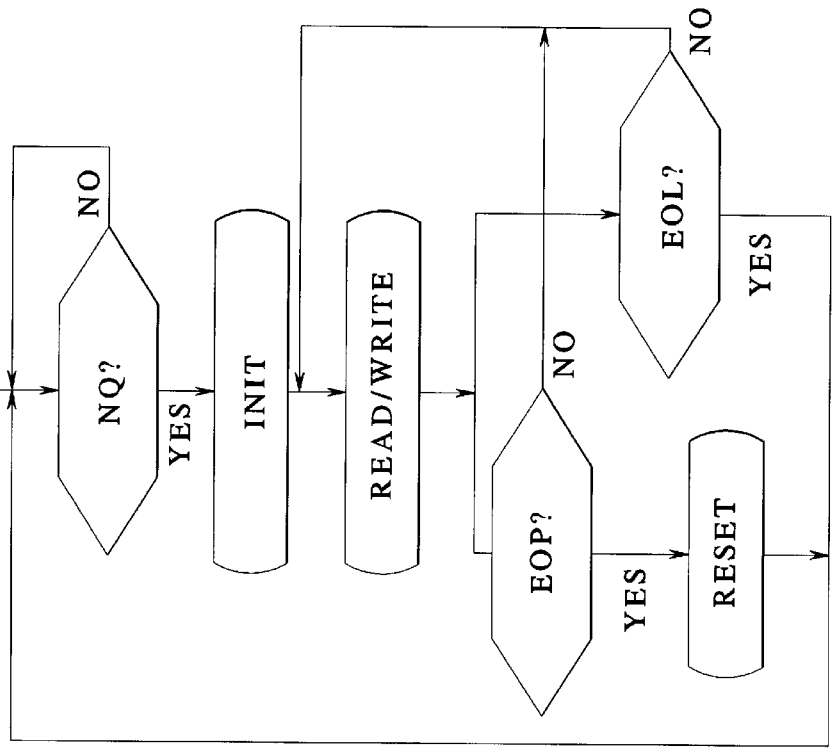
FIG. 4 is a flowchart of the method sequence when writing and reading the memory means.

During the write and read accesses onto the memory means SP, the control logic CL according to FIG. 4 constantly monitors whether a line end EOL or a page end EOP has been reached. As described above, a line end EOL leads to the initialization of the memory means SP. A page end EOP leads to the generation of a reset signal RESET that is conducted to the memory means SP. The register and memory contents of the memory means SP are set to the value zero on the basis of this reset signal RESET. The decompression of a new page can be subsequently begun.

The memory means SP thus serves for the sequential storing and readout of a specific dataset. To that end, it contains a memory RAM that can be read and written in parallel and a memory control means CON. The latter sees to it that, upon prescription of a safety margin, memory areas whose data were previously read out at least once are sequentially written in succession. In the specific embodiment, the memory RAM is preceded by an input interface SPU and followed by an output interface PSU. These accept or, respectively, hand over the data serially toward the outside and in parallel toward the memory RAM.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Memory system for simultaneously reading and writing data, comprising:

a memory whereby data can be word-sequentially written and word-sequentially read, and a memory control device coupled to the memory and having first and second addressing devices;

the memory control device having a register that can be set to a defined value, which is followed by a subtractor that subtracts a predetermined amount from a value of the register;

the register having an output coupled to inputs of a first incrementable and loadable counter for writing a read address thereinto and to inputs of the subtractor;

the subtractor having an output coupled to inputs of a second incrementable and loadable counter for writing a write address thereinto and to inputs of the register;

the first and second incrementable and loadable counters being incrementable independently of one another with a respective control line;

a controllable device coupled to the first and second incrementable and loadable counters, for determining which of the contents of the first and second incrementable counters is to be used as memory addressing;

and whereby the incrementing ensues such that, when writing and reading, data in the memory is only overwritten when the data has been read out at least once.

2. Memory system according to claim 1, wherein the memory system further comprises:

an input interface that serially accepts data and outputs data in parallel to the memory (RAM); and an output interface that accepts data in parallel from the memory and outputs data serially.

3. Memory system according to claim 2, wherein said input interface contains a serial-to-parallel converter and a first buffer memory that accepts the data from the serial-to-parallel converter and outputs the data to the memory; and said output interface contains a parallel-to-serial converter and a second buffer memory that accepts data from the memory and outputs the data to the parallel-to-serial converter.

4. Memory system according to claim 1, wherein the register accepts the output signal from the subtractor in response to a corresponding pulse.

5. Method for simultaneously reading and writing data in a memory, into which data can be word-sequentially written and word-sequentially read, and that is controllable by a memory control device having first and second addressing devices, comprising the steps of:

setting a register to a predefined value;

transferring the predefined value into a first incrementable counter and into a subtractor;

transferring the predefined value diminished by a predefined amount by the subtractor into a second incrementable counter;

reading the memory by repeated addressing of the memory with the content of the first incrementable counter;;
incrementing the first incrementable counter;
addressing the memory with the content of the second incrementable counter;
writing into the memory area of the memory selected according to the content of the second incrementable counter, whereby data is only overwritten when such data has been read at least once;
incrementing the second incrementable counter;
whereby serially incoming data is accepted by an input interface and data is simultaneously serially output by an output interface.

6. Method according to claim 5, wherein the serially incoming data is written in parallel into the respectively selected memory area of the memory; and data is read out parallel from the respectively selected memory area of the memory and is handed over to the output interface that serially outputs the data.

* * * * *